United States Patent [19]

Laton et al.

[11] Patent Number: 4,871,984

[45] Date of Patent: Oct. 3, 1989

[54] SURFACE ACOUSTIC WAVE OSCILLATOR

[75] Inventors: Richard W. Laton, Lexington; Charles E. Chase, Jr., Needham; Gary K. Montress, Westford, all of Mass.

[73] Assignee: Raytheon Company, Lexington, Mass.

[21] Appl. No.: 210,907

[22] Filed: Jun. 24, 1988

[51] Int. Cl.[4] .............................................. H03B 5/12
[52] U.S. Cl. ................................. 331/107 A; 331/76; 307/522
[58] Field of Search ........... 331/76, 77, 107 A, 108 B, 331/135, 136, 175; 333/150–156; 310/313 R, 313 D; 307/520, 522, 523; 328/138

[56] References Cited

U.S. PATENT DOCUMENTS 4,249,146  2/1981  Yen et al. .
4,433,315  2/1984  Vandegraaf ...................... 331/76 X

FOREIGN PATENT DOCUMENTS 1523196  8/1978  United Kingdom ........... 331/107 A

OTHER PUBLICATIONS

Dodson et al., Saw Stabilized Radiosondes, Conference: 1981 IEEE MTT-S Int. Microwave Symp. Digest, Los Angeles, CA. (Jun. 15–19, 1981), pp. 377–379.
Dodson et al., Injection Locked Saw Oscillators, Conference: 1980 Ultrasonics Symp. Proceedings, Boston, MA. (Nov. 5–7, 1980), pp. 268–271.

Primary Examiner—Eugene R. LaRoche
Assistant Examiner—Robert J. Pascal
Attorney, Agent, or Firm—Denis G. Maloney; Richard M. Sharkansky

[57] ABSTRACT

A microwave surface acoustic wave resonator stabilized oscillator includes an amplifier having an input terminal and an output terminal and a feedback circuit disposed around said amplifier for providing a closed loop about said amplifier having an integral multiple of $2\pi$ radians of phase shift and excess small signal gain at a frequency $f_o$. The SAW resonator is disposed in the feedback means and is selected to operate in a fundamental mode of operation and provides a resonant circuit having a resonant frequency $f_o$. The feedback circuit around the amplifier causes the loop to oscillate at a frequency at which the phase shift is an integral multiple of $2\pi$ radians and which has excess small signal gain. As the circuit starts to oscillate, the overall gain in the loop is compressed and the loop amplifier is forced to operate in a non-linear region. Operation in non-linear region causes the amplifier to generate harmonics of the fundamental frequency and thus, by providing a circuit which extracts the harmonics of the fundamental frequency, rather than the fundamental frequency itself, the frequency range of the amplifier can be extended. Furthermore, by keeping the fundamental frequency signal in the oscillator loop, the required gain of the loop amplifier may be decreased by up to 3 db and thus can potentially lower the noise floor of the oscillator by comparable figure.

7 Claims, 2 Drawing Sheets

SURFACE ACOUSTIC WAVE OSCILLATOR

BACKGROUND OF THE INVENTION

This invention relates generally to oscillators having a surface acoustic wave device as a frequency stabilizing element and more particularly to surface acoustic wave oscillators which operate at high frequencies.

As is known in the art, surface acoustic wave devices utilize the propagation of ultrasonic acoustic waves in piezoelectric materials. In particular, such devices generally include a substrate having a surface which supports surface wave propagation and a pair of transducers disposed on said surface to couple to said surface wave propagation. Generally, each transducer is comprised of a pair of interdigitated conductive members having a first set of conductive stripes connected to a first terminal and a second set of said conductive stripes connected to a second, different terminal. When a voltage is impressed across the pair of terminals of a first one of said transducers, the voltage is propagated as a stress wave through the surface wave propagation surface, until it is coupled to the second transducer causing an output voltage across the pair of terminals of the second transducer. For typical piezoelectric materials, propagation velocities $10^3$ to $10^4$ m/sec are common. In general, due to propagation velocities of the acoustic waves and photolithographic limitations on the spacing of the interdigitated conductive stripes of the transducers practical surface acoustic wave devices are generally limited to operation in the range of 30-800 MHz.

Nevertheless, there is a need to operate SAW oscillators at even higher frequencies, such as up to X band (8 GHz to 12 GHz) and beyond for applications such as radar, electronic countermeasures and communication systems.

Present technique for extending the frequency of operation of SAW stabilized oscillators include the use of frequency multipliers at the output of the oscillator, use of electron-beam lithography to decrease spacing limitations and thus extend the frequency limits of SAW resonators, and the use of SAW devices which operate in a harmonic or non-fundamental mode of operation.

The foregoing approaches each present limitations in the usefulness of the technique to extend SAW oscillator frequency of operation. The use of a frequency multiplier at the output of the oscillator increases the system complexity of the oscillator by increasing the number of circuits required and may also increase the phase noise of the oscillator. Furthermore, due to the increase in the number of circuits, the reliability of the oscillator is reduced and the cost of the oscillator is increased. A problem with the use of e-beam lithographic techniques is the need for expensive specialized e-beam equipment which increases the cost of the SAW component in the oscillator. Further, throughput rates of e-beam lithography are relatively low compared to photolithography, thus adding to the cost of the SAW component. The problem with using the SAW resonator which operates in a non-fundamental (i.e. harmonic mode of operation) is that performance characteristics of such harmonic-mode devices are poor particularly for oscillator applications. Generally, harmonic-mode devices have relatively high insertion loss and relatively low Q compared with, for example, a fundamental-mode SAW resonator.

Finally, each of these approaches offers an increase in oscillator frequency by only a factor of 2 or 3 at considerable expense in the terms of cost and complexity. Accordingly, it would be desireable to provide a SAW stabilized oscillator which operates at higher frequencies by a factor of at least 2 or 3 and preferably more, and further which is less expensive than current approaches.

SUMMARY OF THE INVENTION

In accordance with the present invention, a microwave SAW stabilized oscillator includes an amplifier having an input and an output and feedback means disposed between the input and output of the amplifier for providing a closed loop about said amplifier having a multiple of $2\pi$ radians of phase shift and excess small signal gain at a frequency $f_o$. The feedback means includes a SAW device having a frequency characteristic substantially equal to $f_o$. The oscillator further includes means coupled to the output terminal of the SAW oscillator for extracting from said feedback circuit a signal having a frequency related to $nf_o$, where n is an integer greater than 1, while substantially preventing coupling from said feedback circuit of a signal having the frequency $f_o$. With this particular arrangement, by extracting a signal having a frequency of $nf_o$, a higher output frequency is provided from a SAW stabilized oscillator having a conventional SAW device. This technique has several advantages over prior approaches. First, by avoiding the necessity for using a multiplier, a savings in components is provided. Further, it is believed that the phase noise spectrum is only degraded by a factor of 20 log n which is the same as for an ideal multiplier. Thus, a conventional (i.e. non-harmonic-mode operation) SAW device fabricated from conventional techniques, as well as harmonic mode devices or devices fabricated by the more expensive e-beam photolithography techniques may be used as the frequency stabilizing element to provide an oscillator having an output frequency which is higher by a factor of 2, 3 or more than the fundamental feedback loop frequency. Further still, since ideally no fundamental power is extracted from the loop, the required loop gain is reduced potentially by up to 3 db. Such a reduction in required loop gain can lead to a potentially lower phase noise floor for the oscillator.

This approach is based on the recognition that higher frequencies are already present in the oscillator. As is known, a circuit can only be made to oscillate if there is a closed loop about which the phase shift in the circuit is an integral multiple of $2\pi$ radians and that has excess small signal gain at a particular frequency. It is also known that when oscillation commences, oscillations build up in amplitude until the overall loop gain is compressed to unity, causing the loop amplifier to operate in a non-linear operating region. Operation of the loop amplifier in a non-linear region causes the amplifier to amplify the fundamental $f_o$, as well as generate harmonics of the fundamental frequency $f_o$. That is, signals at frequencies of $2f_o$, $3f_o$, $4f_o$ etc. are produced, with each of the harmonic frequencies having decreasing amplitude. However, the amplitude of the second harmonic is typically only 13 to 15 db below the fundamental, and thus is comparable to the harmonic generation efficiency of frequency multipliers. By techniques to extract a harmonic frequency which is already present in the oscillator loop, one can obtain an output frequency from the SAW oscillator which is a higher harmonic of the feedback loop fundamental frequency.

Extracting this signal at $2f_o$ or higher should have no effect, however, upon the loop characteristic of the oscillator because the SAW device although approximately matched at $f_o$ is nearly completely mismatched at $nf_o$, where $n>1$. Thus, the SAW device functions as an ideal band stop or band reject filter for the harmonic frequency components in the loop. This simplifies the design of the extraction circuit, since the circuit need only be designed to reject the fundamental and pass the desired harmonic. Further, in general, there is no need for a 3 db coupler as in conventional approaches, because the SAW device generally will block propagation of the higher order harmonics. Thus, a "coupler function" is provided by the combination of the SAW device acting as band stop or reject filter at frequencies of $nf_o$ for $n>1$ and the frequency extraction circuit which provides a low impedance path at $nf_o$ and a high impedance path at $f_o$.

In accordance with a further aspect of the present invention, the means for coupling the signal having a frequency related to $nf_o$ and for preventing coupling of the signal at the fundamental frequency includes a parallel resonant circuit having a resonant frequency equal to the fundamental frequency. Alternatively, the means for coupling the frequency component $nf_o$ and for preventing coupling of the frequency component $f_o$ includes a high pass filter having a cut-off frequency higher than the fundamental frequency of the feedback loop, but lower than the frequency of the desired harmonic output signal. With this alternative arrangement, the output circuit for the SAW stabilized oscillator may accommodate any SAW resonator provided that the resonant fundamental frequency is sufficiently below the cut-off frequency of the high pass filter so that the filter blocks the fundamental. This provides a less customized and hence, lower cost approach to increasing the frequency of operation of a SAW stabilized oscillator.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figures 1, 3:
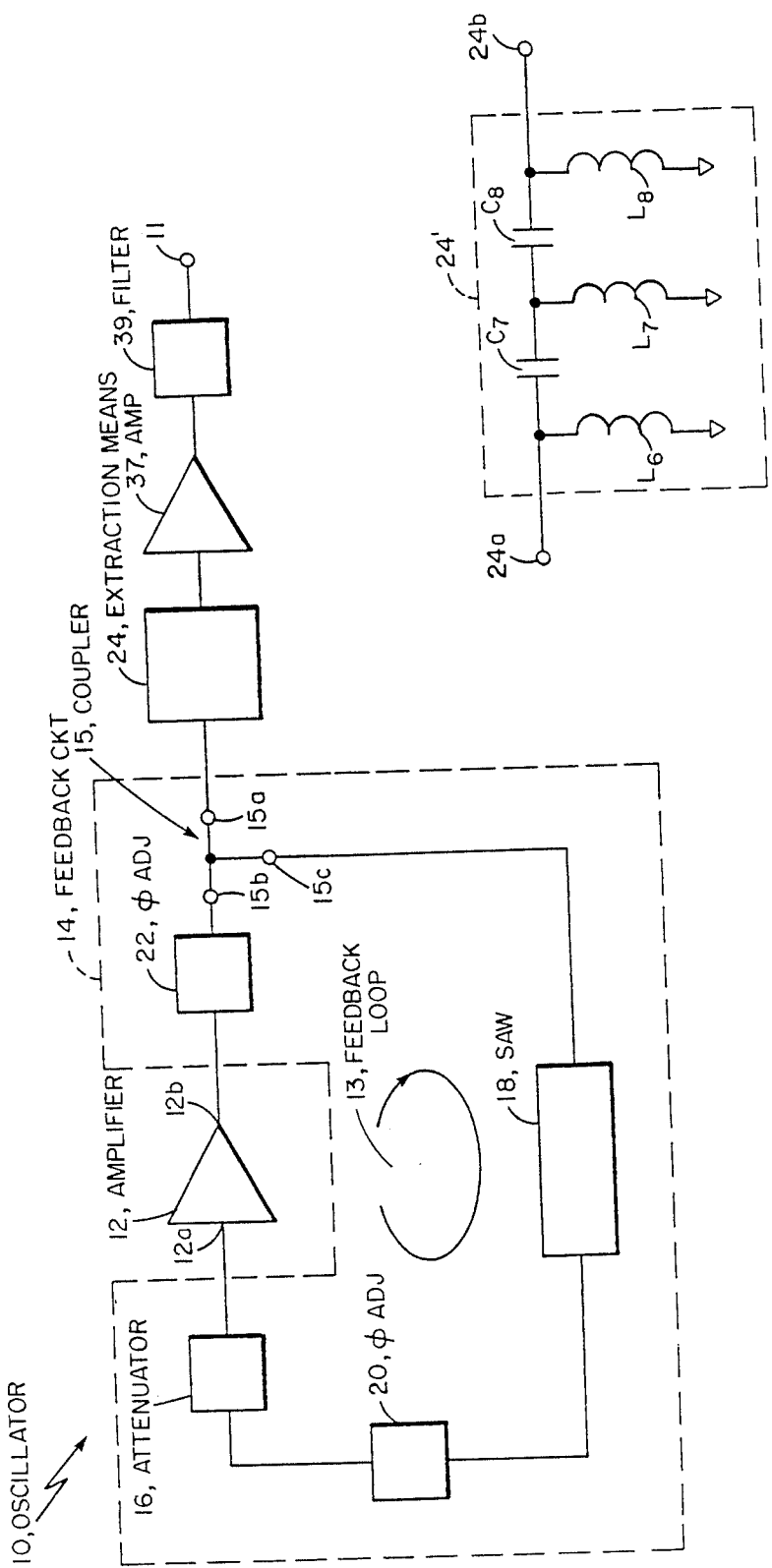
FIG. 1 is a block diagram of a SAW resonator stabilized oscillator having extended frequency of operation in accordance with the present invention.
FIG. 3 is a schematic diagram of an alternate embodiment for a circuit to extract a desired harmonic and prevent extraction of the fundamental frequency component from the SAW based oscillator in accordance with a further aspect of the present invention.

Referring now to FIG. 1, a SAW resonator stabilized oscillator 10 is shown to include a feedback loop generally denoted by an arrow 13. The feedback loop 13 includes a loop amplifier 12 having an input terminal 12a and an output terminal 12b and a feedback circuit 14 disposed to couple the output terminal 12b to the input terminal 12a of the amplifier 12. The feedback circuit 14 includes a discrete phase shift adjustment circuit 22 which is here used to provide a coarse adjustment in the phase shift characteristic of the feedback loop 13. The feedback circuit 14 further includes a coupling means 15 having ports 15a-15c used to provide a pair of outputs at ports 15a and 15c in response to an input fed to port 15b. The output port 15c of coupling means 15 is connected to a SAW device 18 here a SAW resonator. Optionally, other types of SAW devices such as a SAW delay line or SAW bandpass filter may alternatively be used. The SAW resonator 18 is used to stabilize the frequency characteristics of the SAW based oscillator. The SAW resonator has a resonant frequency selected in accordance with the other components of the feedback loop 13 to provide the feedback loop with a phase shift characteristic which is an integral multiple of $2\pi$ radians at a desired feedback loop frequency $f_o$ and with a sufficient amount of excess small signal gain at $f_o$ to permit oscillation in the feedback loop at $f_o$. Here, the resonator 18 is designed for operation in the fundamental mode, that is the resonator 18 is designed to have minimum insertion loss substantially at $f_o$.

The SAW resonator 18 is connected to a continuous phase shift adjustment circuit 20, here a meandered transmission line which is selectively connected, via a wire bond, (not shown) to permit a continuous phase shift adjustment in the phase shift characteristics of the feedback loop 13. The output of the meandered line is connected to an attenuator 16 which is used to adjust the gain characteristics of the circuit in the feedback loop of the oscillator 10.

Here, coupling means 15 is provided by the SAW device 18 in combination with a harmonic frequency extraction circuit 24, as will be described shortly. The second output 15a of the coupler function 15 is connected to a frequency extraction means 24. As mentioned previously, when the amplifier operates in a non-linear mode it generates energy at a harmonic $nf_o$ where $n>1$. Thus, the frequency extraction means 24 is used to extract a desired, selected higher order harmonic $nf_o$ of the feedback loop fundamental frequency $f_o$. The extraction means 24 is also designed to have a passband which will block a signal having the fundamental frequency component $f_o$ from being coupled from loop 13. The output circuit of the amplifier generates the harmonics. Accordingly, since the SAW device blocks the harmonics, it is desirable to locate the extraction means 24 at the output of the amplifier. However, some small portion of the harmonics generated feed through to the input. Accordingly, in some applications, it may be preferable to locate the extraction means 24 at the input of the loop amplifier 12.

In order to couple a signal having a frequency of $nf_o$ from the feedback loop with a high degree of efficiency, a coupler designed to operate at $nf_o$ is required. The coupling means 15 is here provided by the frequency extraction means 24 and the SAW resonator 18 which acts as a band reject filter for signals having a frequency of $nf_o$, where $n>1$. Resonator 18 acts as a band reject filter because the input impedance and output impedance of the resonator are nearly matched with the impedance in the feedback circuit at $f_o$ and 15 are highly mismatched at frequencies $nf_o$, where $n>1$. Accordingly, the resonator 18 and the frequency extraction means 24 provide in combination the coupling means 15 for the oscillator 10. For frequencies of $nf_o$, the coupling means 15 provides a low impedance path between the amplifier output 12b through the frequency extraction means 24, and a high impedance path from the amplifier output 12b through the SAW device 18.

The frequency extraction means 24 is here coupled to an amplifier 37 to provide a requisite output signal level from the oscillator and to prevent loading of the oscillator 10. Optionally, a second filter 39 is provided at the output of amplifier 37 to increase signal purity at the output of the oscillator.

Figure 2:
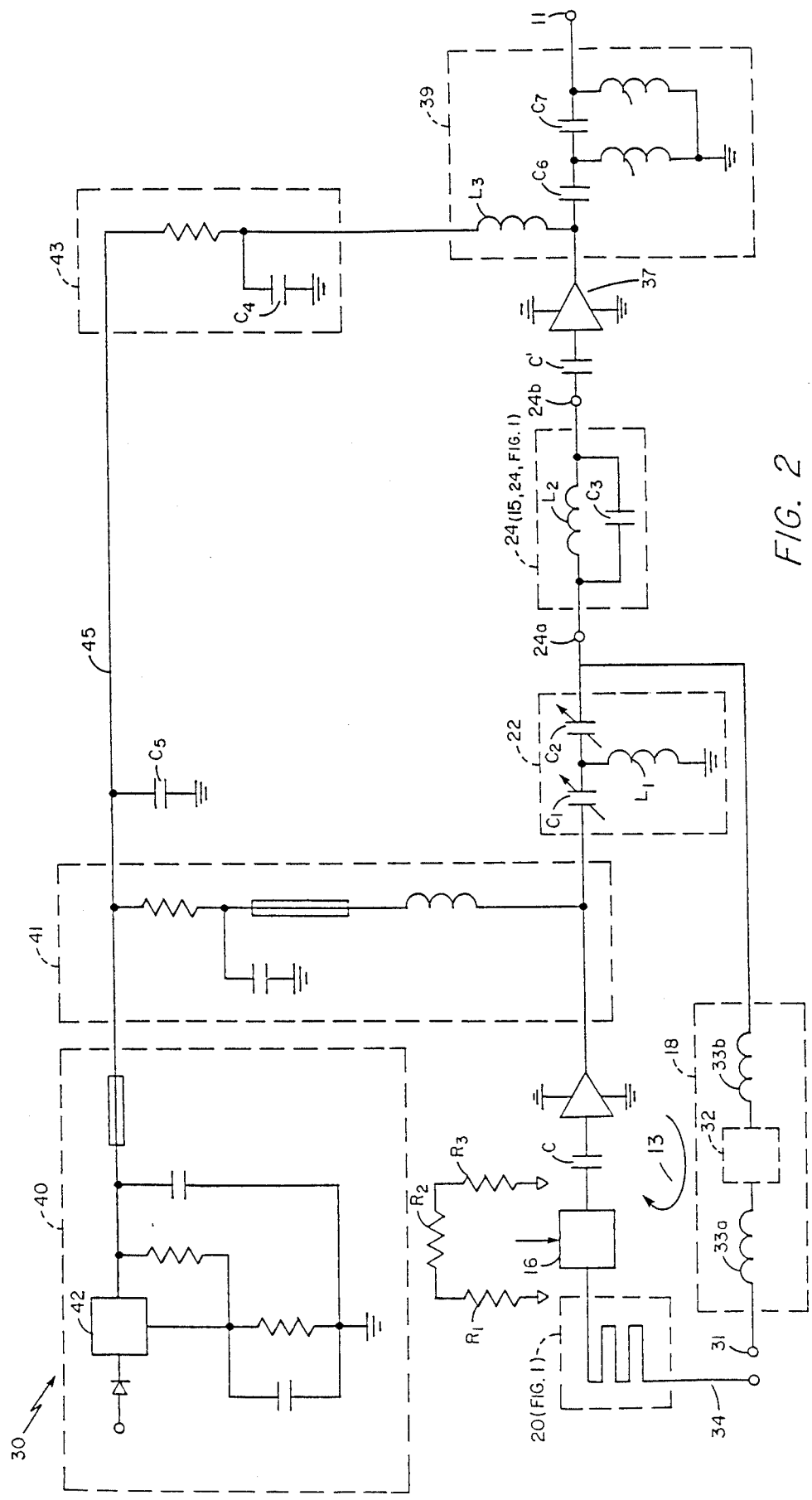
FIG. 2 is a schematic diagram of a preferred embodiment of a SAW stabilized oscillator as generally described in conjunction with FIG. 1.

Referring now to FIG. 2, a more detailed embodiment of the SAW based oscillator will be described. As shown in FIG. 2, the loop amplifier 12 includes a bias network 41 comprised of passive elements (not numbered), as shown, connected to a well regulated power supply generally denoted by the reference designation 40 including a voltage regulator chip 42 and other passive components connected in a conventional manner as is also known. The output 12a of loop amplifier 12 is here connected to the discrete phase shift adjustment circuit 22. The discrete phase shift adjustment circuit 22 here comprises series connected capacitors $C_1$ and $C_2$ with a shunt mounted inductor $L_1$ connected between the common connection of the capacitors $C_1$, $C_2$ and ground. Here capacitors $C_1$ and $C_2$ are so-called binary capacitors which make possible fine mechanical adjustments in total phase shift around the loop. Alternatively, varactor diodes may be used to permit electrical adjustment of the phase shift characteristic. In any event, the capacitance of capacitors $C_1$ and $C_2$ are adjusted to provide a requisite phase shift characteristic to the feedback circuit 14 until the proper oscillator frequency $nf_o$ is obtained.

The SAW device 18 is shown in FIG. 2 to include a SAW resonator 32 and a pair of impedance matching circuits here inductors 33a and 33b, connected in series with the input and output of the SAW resonator, as shown. Inductor element 33a is connected between the output of SAW device 18 and continuous phase adjustment circuit 20 here a meandered transmission line 34 by a wire bond (not shown) which is used to selectively connect terminal 31 to a portion of the meandered line 34. This provides a selected pathlength change to the feedback circuit and, therefore, is used to provide a continuous adjustment in the phase shift characteristic of the feedback circuit 13. The other end of the meandered line 20 is connected to attenuator 16 here comprised of a series connected resistor $R_2$ and a pair of shunt connected resistors $R_1$ and $R_3$ as shown. By changing or adjusting the value of $R_2$, the attenuation ratio of the circuit 16 is correspondingly adjusted to provide higher or lower attenuations, without significant changes in characteristic impedance levels that otherwise could significantly alter the frequency characteristics of the oscillator.

The attenuator 16 is connected to a series capacitor C which is used to decouple the amplifier input from ground via the path provided to ground through resistors $R_1$, $R_2$, $R_3$ in the attenuator. This is used to prevent an upset in the bias conditions of the amplifier 12 as provided by the bias circuit 41.

The other end of the fine phase shift adjustment circuit 22 is connected to the frequency extraction means 24 which is here comprised of an inductor $L_2$ connected between terminals 24a and 24b as shown and a capacitor $C_3$ also connected between terminals 34a and 34b as shown. The value of capacitance of $C_3$ and the value of inductance for inductor $L_2$ are selected in accordance with the fundamental frequency component of the feedback loop 13 to provide a parallel resonant circuit at frequency $f_o$. The parallel resonant circuit 34b is connected to a second DC blocking capacitor C' which has a second end connected to second amplifier 37. Amplifier 37 is used to buffer the oscillator 10, that is to prevent loading of the oscillator 10 at oscillator output 11, as mentioned above. The buffer amplifier 37 is biased through a second bias circuit 43 here having passive components including a bias resistor $R_4$, choke $L_3$ and bypass capacitor $C_4$. Bias is also fed from the regulated power supply 40. As also shown, a filtering capacitor $C_5$ is connected between the power supply line 45 and ground as shown.

The output of amplifier 37 is connected to a six element, high pass filter 39 comprised of elements $L_3$–$L_5$ and $C_4$–$C_6$ as shown. The first shunt path of the filter 28 is provided to ground through elements $L_3$ and $C_4$ as shown. Accordingly, elements $L_3$ and $C_4$ are used to provide D.C. bias to the amplifier 37 and are also used as filtering elements in the filter 39. Depending upon design requirements, filter 39 is generally used to supress $f_o$ and harmonics of $f_o$ other than the desired harmonic used to provide the output signal of the oscillator 10. Of course multiple outputs each being different harmonics of $f_o$ may also be used.

Referring now to FIG. 3, an alternate embodiment 24' for the frequency extraction means is here shown to include a five element high pass filter comprised of shunt inductor elements $L_6$–$L_8$ and series capacitive elements $C_8$, $C_9$. The filter 24' is designed and accordingly, the values of inductance for elements $L_6$–$L_8$ and capacitance for elements $C_8$ and $C_9$ are selected to provide a high pass filter having a cut-off frequency $f_c$ which is higher than the fundamental frequency component $f_o$ but lower than the desired harmonic of the fundamental $f_o$ which is selected to be extracted from the loop 13.

Use of a high pass filter as the harmonic frequency extraction means has several advantages over use of a resonant circuit 24. Since the cut-off frequency need only be lower than the desired output frequency, the output stages of the oscillator may be designed to accommodate SAW resonators of various fundamental frequencies. Further, a high pass filter requires less stringent tolerances on the electrical parameters of the high pass filter elements than the alternative resonant circuit approach.

The above embodiments have been described with a SAW device such as a resonator or delay line operating in fundamental mode with the feedback loop characteristics selected to have the loop frequency substantially equal to the fundamental frequency of the SAW device. Other arrangements are possible. For example, the SAW device may be a delay line or resonator operating in a non-fundamental mode at a frequency $nf_o$. The loop frequency of such an oscillator would be designed to be $nf_o$. Due to non-linear operation of the amplifier, the amplifier will generate harmonics of $nf_o$. Thus, the frequency extraction means 34 would be designed to extract harmonics of $nf_o$ (i.e. frequencies $2nf_o$, $3nf_o$ etc). Thus, an oscillator output of $2nf_o$ or higher is provided from an oscillator having a feedback loop frequency of $nf_o$.

Having described preferred embodiments in the invention, it will now become apparent to one skilled in the art that other embodiments incorporating their concepts may be used. It is felt, therefore, that these embodiments should not be limited to disclosed embodiments, but rather should be limited only by the spirit and scope of the appended claims.

What is claimed is:

1. A microwave SAW stabilized oscillator, comprising:
   means for providing a closed loop having an integral multiple of $2\pi$ radians of phase shift and excess small signal gain at a frequency $f_o$, said means comprising:
   an amplifier; and
   a SAW device having a frequency characteristic substantially equal to $f_o$; and
   means for extracting from said feedback circuit a signal having a frequency equal to $nf_o$, where n is an integer greater than 1 and for preventing from being coupled from said feedback circuit a signal having the frequency component $f_o$.

2. The oscillator of claim 1 wherein said extraction means further includes:
   means for preventing signals having a frequency of $nf_o$ from propagating around said feedback loop.

3. The SAW oscillator of claim 2 wherein said extraction means includes a parallel resonant circuit coupled to said feedback means having a resonant frequency equal to $f_o$.

4. The SAW oscillator of claim 2, wherein:
   said extraction means includes a high pass filter coupled to the output of said feedback means having a cut-off frequency higher than the fundamental frequency $f_o$ of the loop means but lower than the selected harmonic frequency $nf_o$ coupled from the output of the oscillator.

5. A microwave SAW stabilized oscillator, comprising:
   an amplifier having an input and output;
   feedback means, disposed between the input and output of the amplifier, for providing a closed loop about said amplifier having an integral multiple of $2\pi$ radians of phase shift and excess small signal gain at a frequency $f_o$, said feedback means comprising:
   a SAW resonator disposed to operate in a fundamental mode of operation having a resonant frequency substantially equal to $f_o$; and
   means for extracting from said feedback means a signal having a frequency component equal to $nf_o$, where n is an integer greater than 1 and for preventing from being coupled from said feedback circuit a signal having the fundamental frequency component $f_o$.

6. The SAW oscillator of claim 5 wherein said extraction means includes a parallel resonant circuit coupled to said feedback means having a resonant frequency equal to $f_o$.

7. The SAW oscillator of claim 5 wherein said extraction means includes a high pass filter coupled to the output of said feedback means having a cut-off frequency higher than the frequency $f_o$ of the feedback means and lower than the selected harmonic frequency $nf_o$ coupled from the output of the oscillator.

* * * * *